United States Patent [19]

Soref

[11] Patent Number: 5,115,335
[45] Date of Patent: May 19, 1992

[54] ELECTROOPTIC FABRY-PEROT PIXELS FOR PHASE-DOMINANT SPATIAL LIGHT MODULATORS

[75] Inventor: Richard A. Soref, Newton Centre, Mass.

[73] Assignee: The United States of America as represented by the Secretary of the Air Force, Washington, D.C.

[21] Appl. No.: 546,482

[22] Filed: Jun. 29, 1990

[51] Int. Cl.⁵ ............... H01L 27/14; H01L 29/205; G02F 1/01
[52] U.S. Cl. .................... 559/248; 359/26; 357/4; 357/16; 357/30
[58] Field of Search .............. 350/355, 356; 357/4, 357/30, 16; 359/248, 260

[56] References Cited

U.S. PATENT DOCUMENTS

| | | | |
|---|---|---|---|
| 3,691,389 | 9/1972 | Ellis et al. | 357/30 |
| 4,410,240 | 10/1983 | Medernach | 350/356 |
| 4,525,687 | 6/1985 | Chemla et al. | 357/4 |
| 4,541,015 | 9/1985 | Itoh et al. | 357/30 |
| 4,790,635 | 12/1988 | Apsley | 350/355 |

OTHER PUBLICATIONS

Soref et al. "Carrier Refraction in Quantum Well Waveguides" *Applied Optics*, vol. 28, pp. 3577-3580 (Sep. 1, 1989).

Horner, J. L. et al., "Phase-Dominant Spatial Light Modulators", Electronics Letters, May 12, 1988, vol. 24, No. 10, pp. 626-627.

*Primary Examiner*—Jerome Jackson, Jr.
*Attorney, Agent, or Firm*—Robert L. Nathans; Donald J. Singer

[57] ABSTRACT

Phase enhancement by resonant Fabry-Perot picture elements in III-V semiconductor spatial light modulators (SLMs) is disclosed. For 95% reflecting electrodes, a phase modulation of $0.7\pi$ rad is found in transmission when the electrooptic input phase is $0.06\pi$ rad. A resonant phase-dominant SLM in a 1.7-$\mu$m-thick AlGaAs/GaAs multiple quantum well (MQW) structure can employ field effects and carrier-induced electrooptic effects within the MQW's.

21 Claims, 6 Drawing Sheets

ELECTROOPTIC FABRY-PEROT PIXELS FOR PHASE-DOMINANT SPATIAL LIGHT MODULATORS

STATEMENT OF GOVERNMENT INTEREST

The invention described herein may be manufactured and used by or for the Government for governmental purposes without the payment of any royalty thereon.

BACKGROUND OF THE INVENTION

Phase-only filters and "phase dominant" spatial light modulators (SLMs) are important new devices for optical signal processing applications. See for example U.S. Pat. No. 4,826,285 issued to Joseph Horner and his paper published in "Applied Optics", Vol. 24, No. 5, pp. 609-611. Techniques are needed for phase-dominant SLMs to enhance the relatively small phase shifts that are found in active semiconductor material. Although there is a large body of literature on FP elements as enhancers of amplitude modulation (AM), scant coverage has been given to the phase modulation (PM) properties of Fabry Perot (FP) resonators, an oversight we hope to remedy.

BRIEF SUMMARY OF THE INVENTION

The use of a Fabry Perot (FP) etalon at each picture element (pixel) is proposed as a phase-enhancement method. The SLM would use partially transparent, plane-parallel, reflective electrodes to sandwich multiple quantum well (MQW) pixel material. The analysis below shows that the increased PM at each pixel is accompanied by the familiar AM of an FP cavity. The dual response might seem undesirable, but further study shows that combined AM and PM is not a problem in this application. Simultaneous AM and PM at each pixel of an optical correlation system was investigated and it was found that the combined AM and PM response could be used to good advantage. See a paper authored by J. L. Horner and R. A. Soref, "Phase-dominant Spatial Light Modulators", Electronics Letters, vol. 24, pp 626-627 (May 12, 1988). The AM did not degrade the signal-to-noise ratio (SNR) on the correlation plane in most instances. In fact, the AM improved the SNR of the phase-dominant SLM in some cases. This implies that the FP approach will be viable. According to the aforesaid paper, the PM should be in the range from $\pi$ to $3\pi$ radians for best results, but large and useful SNR values are obtained for PM in the range of $\pi/2$ to $\pi$ radians, discussed below. The teachings of the present invention apply to diverse electrooptic materials such as liquid crystals where the index perturbation $\Delta n/n$ is 10% or more, and to semiconductors where $\Delta n/n$ is approximately 1%. We shall focus herein on the weaker-perturbation case of semiconductors.

Although bulk semiconductors have significant electrooptic effects, the largest electrooptic effects are found in "bandgap-engineered" superlattices and multiple quantum well (MQW) structures. These are materials grown in microlayers by molecular-beam epitaxy. It is difficult and time consuming to grow an MQW stack with a thickness of more than two microns. Therefore, we propose a practical III-V MQW SLM structure whose stack thickness (d) is less than 2 $\mu$m. The d<2 $\mu$m condition has benefits for increasing the resolution of the SLM because the maximum density of pixels is approximately $\frac{1}{4}d^2$. Non-resonant pixels with d<2 $\mu$m produce insufficient PM, so enhancement is required.

BRIEF DESCRIPTION OF THE DRAWINGS

Other objects, features, and advantages of the present invention will become apparent upon study of the following description taken in conjunction with the drawings in which.

DETAILED DESCRIPTION

Figure 1:
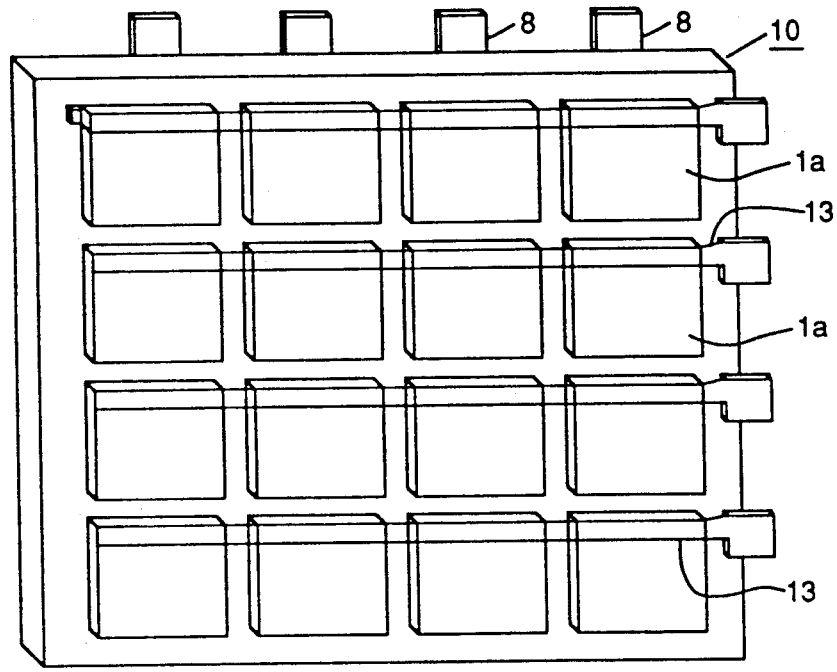
FIG. 1 shows a perspective view of an electrically addressed phase-dominant SLM constructed with Fabry Perot resonator pixels and semiconductor superlattice or multiple quantum well material.

The electrooptic material has a complex index of refraction $n+ik$ in the zero bias condition. When the electrooptic perturbation is turned on, the complex index becomes modified by an amount $\Delta n+i\Delta k$. The optical phase retardation produced by a single-pass through the unbiased material is $2\pi(n+ik)\Gamma D \cos\theta/\lambda$, where $\Gamma$ is the quantum-well filling factor, D is the material thickness including capping layers, $\theta$ is the incidence angle of light on the material and $\lambda$ is the free-space optical wavelength. When voltage or current is applied to the material, an additional optical phase retardation $\epsilon$ occurs. The single-transversal electrooptic phase $\epsilon$ is given by $2\pi(\Delta n+i\Delta k)\Gamma d \cos\theta/\lambda$. For simplicity, we take D=d in this analysis.

We shall make further simplifying assumptions first, that the material is highly transparent at the wavelength of operation (n>>k) and second, that the electrooptic effect is phase dominant at the subgap wavelength ($\Delta n>>\Delta k$). This means that the single-pass phase angles are:

$$\delta = 2\pi n \Gamma d \cos\Theta/\lambda \quad (1)$$

$$\epsilon = 2\pi \Delta n \Gamma d \cos\Theta/\lambda \quad (2)$$

It is convenient to define the total, non-resonant, single-pass input phase as $$\phi = \delta - \epsilon$$

There are two conductive "mirrors" in each FP pixel with reflectances of $r_1$ and $r_2$, respectively. The resonator can be symmetric, $r_1 = r_2 = R$, or the cavity can be asymmetric: $r_1 > r_2$. We define the complex amplitude transmitted through the resonator $A_t e^{i\Phi_t}$ and the complex reflected amplitude $A_r e^{i\Phi_r}$, with the A's and $\Phi$'s real. The basic equations of the FP resonator are well known and have been presented in several textbooks such as Haus, "Waves and Fields in Optoelectronics", (Prentice-Hall Inc., Englewood Cliffs, N.J., 1984). From Eqs 3.45 and 3.46 of Haus, we write $$A_t e^{i\Phi_t} = A_o \frac{\sqrt{(1-r_1^2)(1-r_2^2)} e^{-i\phi}}{(1-r_1 r_2 e^{-i2\phi})} \quad (3)$$

$$A_r e^{i\Phi_r} = A_o \frac{r_2 e^{-i2\phi} - r_1}{1 - r_1 r_2 e^{-i2\phi}} \quad (4)$$

We can solve (3) and (4) for the resonator phase angles $\Phi_t$ and $\Phi_r$ by decomposing the right-hand side of (3) and of (4) into its real and imaginary components, and by examining the imaginary-to-real ratio:

$$\Phi_t = \text{ARCTAN}\left[\frac{(r_1 r_2 - 1)}{(r_1 r_2 + 1)} \text{TAN}\phi\right] \quad (5)$$

$$\Phi_r = \text{ARCTAN}\left[\frac{r_2(r_1^2 - 1)\text{SIN}2\phi}{-r_1(1-r_2^2) + r_2(1-r_1^2)\cos 2\phi}\right] \quad (6)$$

The transmitted and reflected intensities are found by calculating the squared magnitudes of the complex amplitudes (3) and (4), as follows:

$$\frac{I_t}{I_o} = \frac{(1-r_1^2)(1-r_2^2)}{1 + r_1^2 r_2^2 - 2r_1 r_2 \cos 2\phi} \quad (7)$$

$$\frac{I_r}{I_o} = \frac{r_1^2 + r_2^2 - 2r_1 r_2 \cos 2\phi}{1 + r_1^2 r_2^2 - 2r_1 r_2 \cos 2\phi} \quad (8)$$

We now present numerical results for the resonator outputs $\Phi_t, \Phi_r, I_t, I_r$ obtained from Eqns (5)–(8). The symmetric-mirror case $r_1 = r_2 = 90\%$ (case a) was investigated together with two asymmetric mirror cases: $r_1 = 85\%$, $r_2 = 95\%$ (case b) and $r_1 = 45\%$, $r_2 = 90\%$ (case c). The product $r_1 r_2$ is the same in case b as in case a; while in case c, the $r_1 r_2$ product is half that of case b.

The $\Phi_t, \Phi_r, I_r, I_r$ results are plotted as a function of $\phi$ in FIGS. 3–6 for the three cases. We find in FIGS. 3 and 5 that the phases $\Phi_t$ and $\Phi_r$ change rapidly about a critical point $\phi_c$:

$\phi_c = m\pi$ radians, where m is any integer.
The maximum change in $\Phi$ is $\pi$ radians for both transmissive and reflective etalons, although the $\pi$ modulation requires a very small $\phi$ excursion in the reflective case, compared to a $\phi$ excursion of $\pi$ in the transmissive case.

No difference between case a and case b is found in transmission, but there is a difference in reflection. For case b, the $I_r$ minimum is not zero, and the asymmetric mirrors cause a severe rounding of the two peaks in the $\Phi_r$ curve. Hence, the reflective asymmetric SLM appears ill-suited for this application. The symmetric mirror condition is judged to be best for PM SLMs, and we note the $r_1 r_2$ equivalence of balanced and unbalanced mirrors in transmission.

The above results are now applied to phase-dominant SLMs. As indicated in FIG. 1, parallel rows of light transmissive pixel-sized partially reflecting etalon mirror-electrodes $1a$ are electrically connected by strip-like conductive films 13. Orthogonal electrically conductive strips 8 connect pixel-sized etalon mirror electrodes $1b$ in column arrays, creating an X-Y array of pixel-resonator sandwiches with the MQW body 10. Each crosspoint of mirror electrodes $1a$ and $1b$ defines a pixel portion, each including a p-i-n diode comprising p region 7, intrinsic MQW stack 5, and n region 9. Vertical address column voltage logic 17, with horizontal address (row) logic 19 coact with the strips 8 and 13 in the well known manner to X-Y address each pixel portion of MQW body 10.

Figure 2:
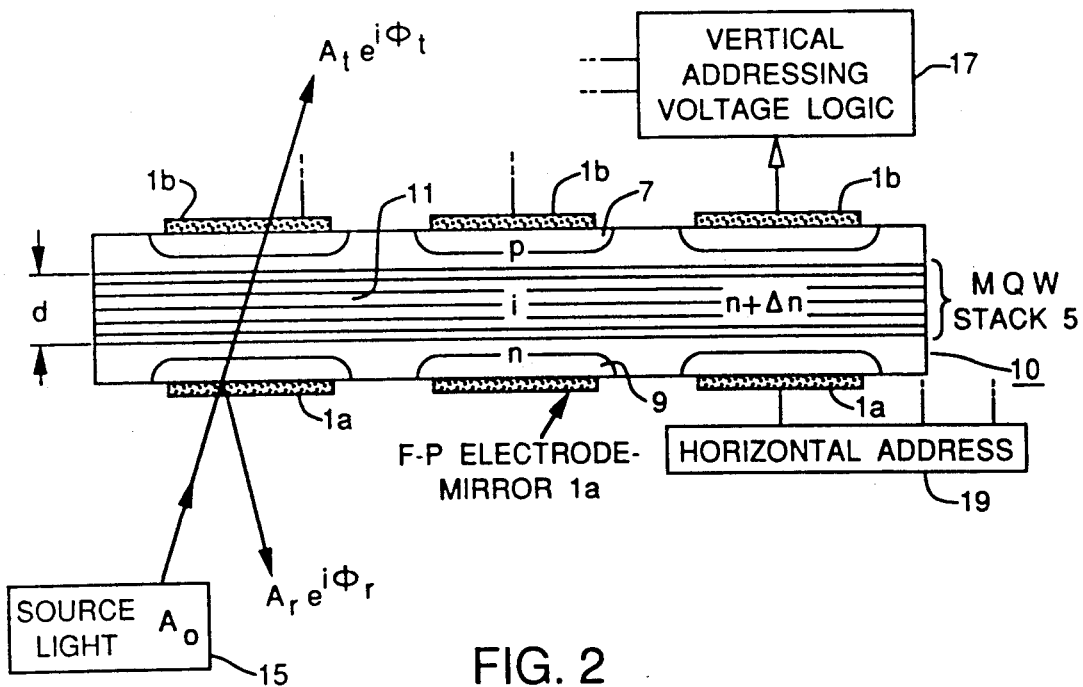
FIG. 2 includes a cross-sectional view of a key portion of FIG. 1.
Figure 3:
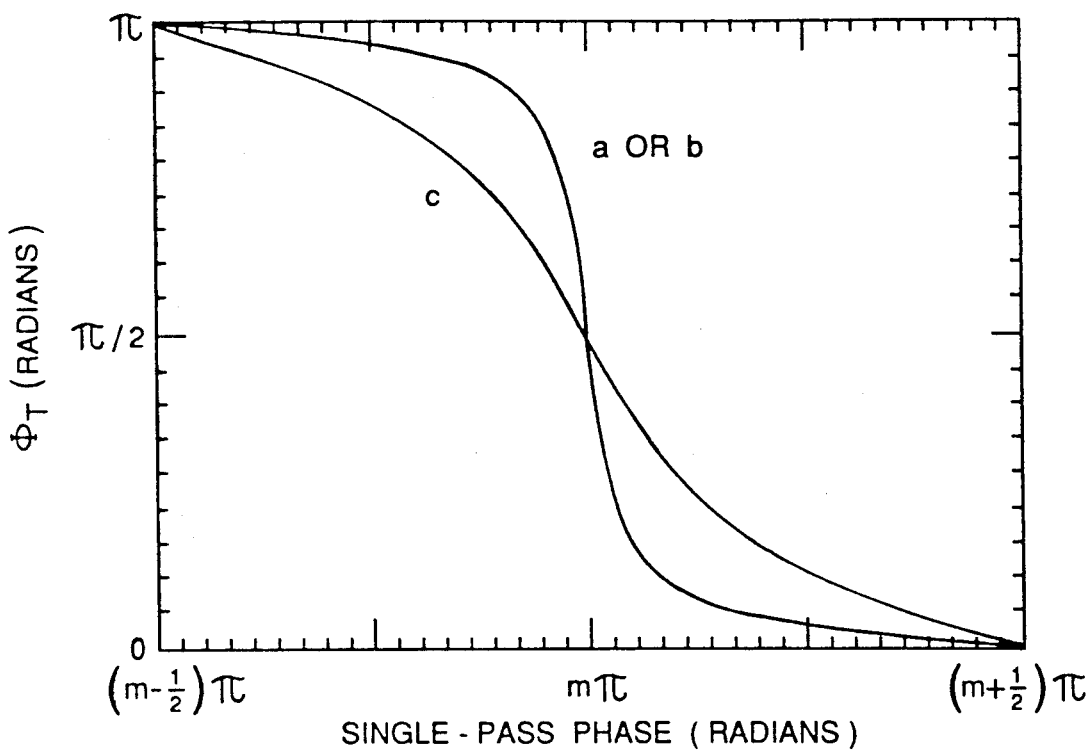
FIG. 3 illustrates calculated output phase of FP pixel in transmission for various cases (a), (b), and (c).
Figure 4:
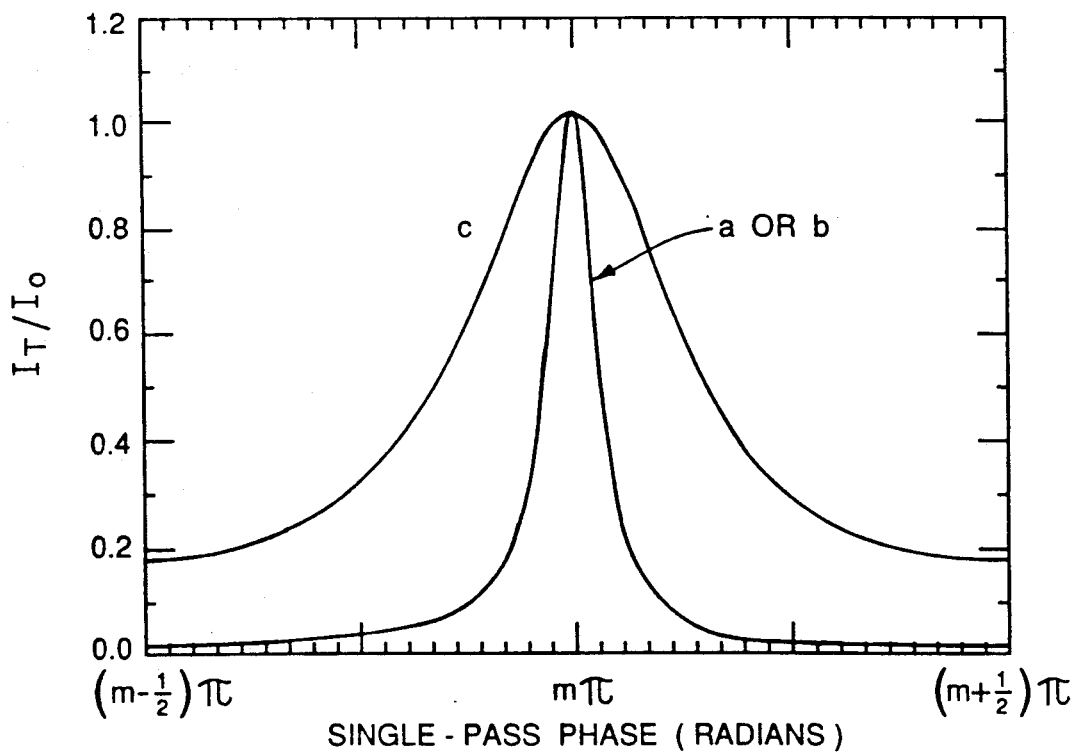
FIG. 4 illustrates calculated output intensity of FP pixel in transmission, with (a), (b), (c) as in FIG. 3.
Figure 5:
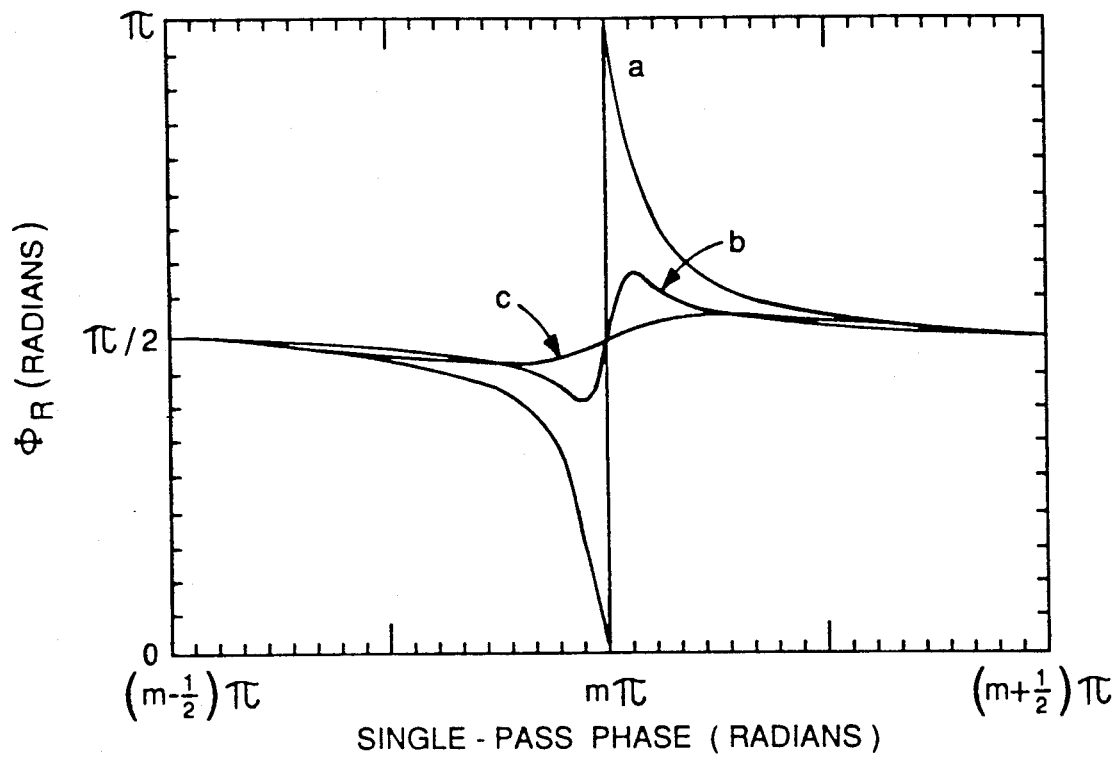
FIG. 5 illustrates calculated output phase of FP pixel in reflection, with (a), (b), (c) as in FIG. 3.
Figure 6:
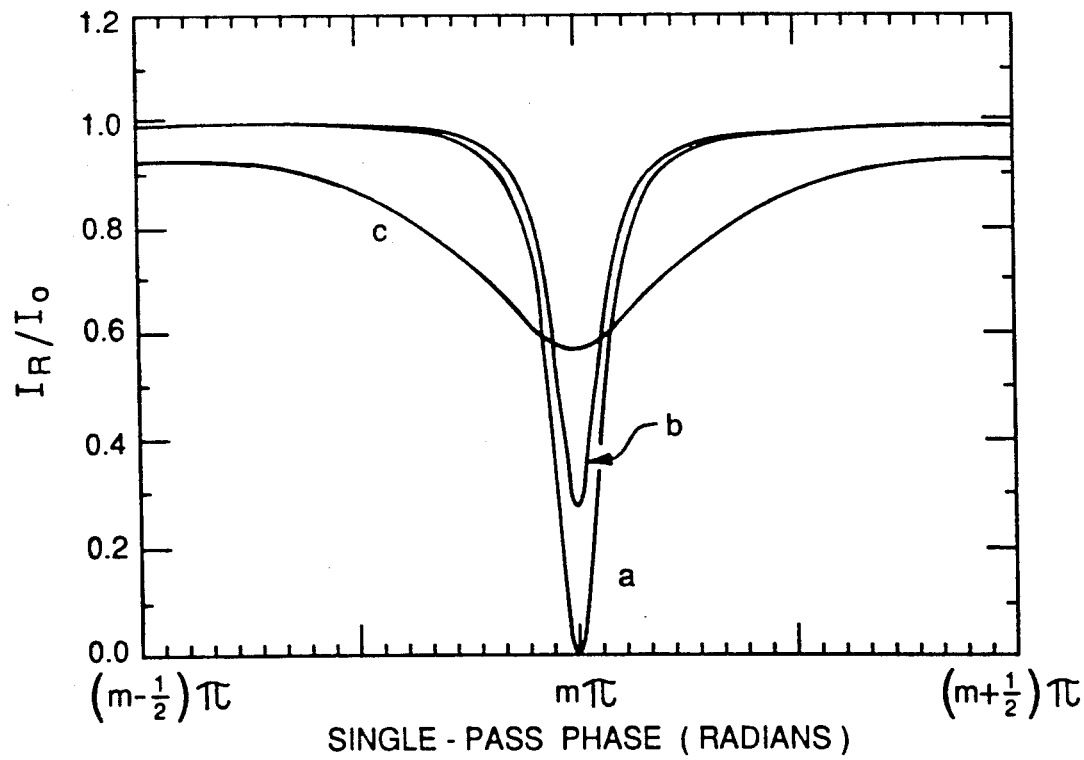
FIG. 6 illustrates calculated output intensity of FP pixel in reflection, with (a), (b), (c) as in FIG. 3.

The light source 15, directs below-band-gap light through the sandwiches, which are configured to form resonant Fabry Perot etalons, whereas voltages applied to the etalons will forward or reverse bias the p-i-n diodes, as will be explained hereinafter. FIG. 1 illustrates column strip conductors 8 and row strip conductors 13; the Fabry-Perot layered mirrors $1a$ and $1b$ would be placed on the inner side of the strips 8 and 13, contacting the p, n regions of the MQW core body 10. The corresponding rearward layered mirrors $1b$ are not shown in FIG. 1. The nature of appropriate layered semiconductor mirrors are well known to those skilled in the art and thus need not be explained in greater detail. The strip conductors 8 and 13 have not been shown in FIG. 2 in the interest of clarity.

The voltage-off state $\epsilon = 0$ is the initial condition of the SLM. The initial bias point $\delta_1$ is obtained by choosing the material thickness d. We now bias each FP pixel at a $\delta$-value slightly to the left of $\delta_c$ (namely, $\delta_1 = m\pi - \delta_o$) and to use a small electrooptic excursion $\epsilon$ to move $\Phi$ across its rapid-change region. This will produce a pixel phase modulation of $0.7\pi$ radians. The initial and final input angles $\phi_i$ and $\phi_f$ are positioned symmetrically about the critical point. Since $\phi_f - \phi_i = \epsilon$, we find $\delta_o = \epsilon/2$, and $\phi_i = m\pi - \epsilon/2$ $\phi_f = m\pi + \epsilon/2$ In essence, this is a binary-phase scheme with outputs $\Phi_i$ and $\Phi_f$. An immediate consequence of the symmetric placement of $\phi$ about $m\pi$ is that $\Delta I = 0$, that is, there is no AM accompanying the PM.

To understand the SLM design tradeoffs, we made detailed calculations of phase and intensity for the symmetric case $r_1 = r_2$, using the R values 0.7, 0.8 and 0.9. The large R's were chosen because high reflectance is needed to optimize the phase modulation. The results are presented in FIGS. 7–10, where $\Delta\Phi_t$, $I_t$, $\Delta\Phi_r$, $I_r$ are plotted versus $\epsilon/2$ over a 0–10° range. The phase ordinate $\Delta\Phi$ is $\Phi(\phi_f) - \Phi(\phi_i)$. The intensities were calculated in order to determine the optical throughput of the resonant SLM in reflection or in transmission. A high throughput is needed to assure high SNRs in the optical processing system.

Figure 7:
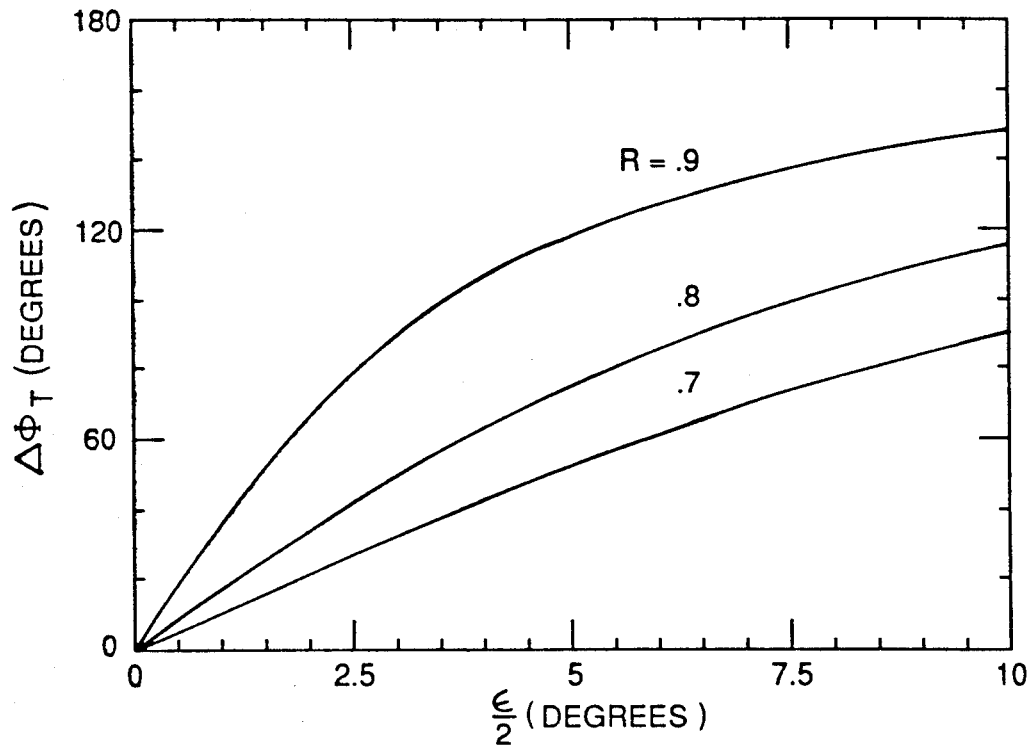
FIG. 7 illustrates transmissive phase modulation of FP pixel vs. $\epsilon/2$ for an electrooptic excursion of $\epsilon$ about the critical point.
Figure 8:
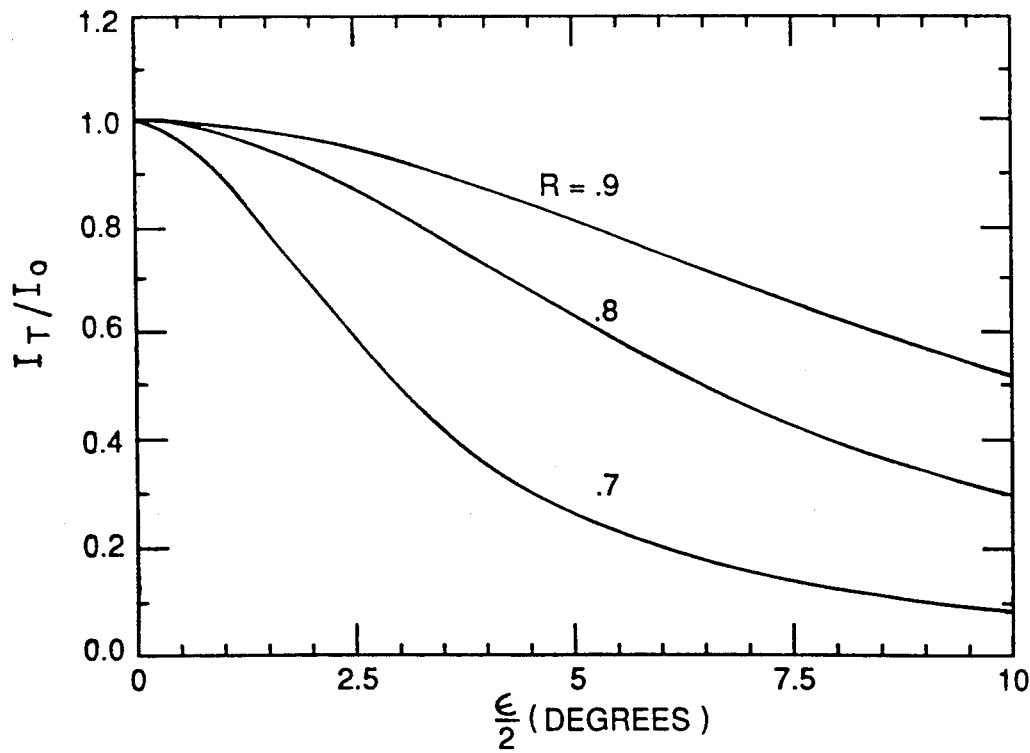
FIG. 8 illustrates transmitted intensity of FP pixel vs. $\epsilon/2$.
Figure 9:
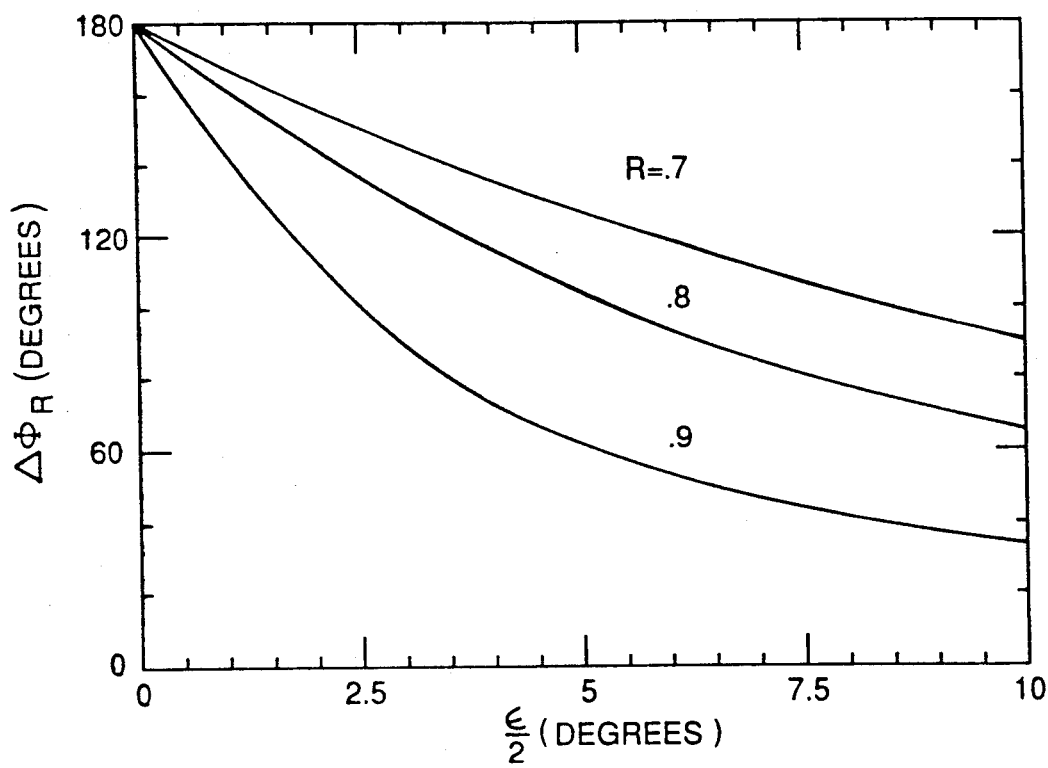
FIG. 9 illustrates reflective phase modulation of FP pixel vs. $\epsilon/2$ for an electrooptic excursion of $\epsilon$ about the critical point.
Figure 10:
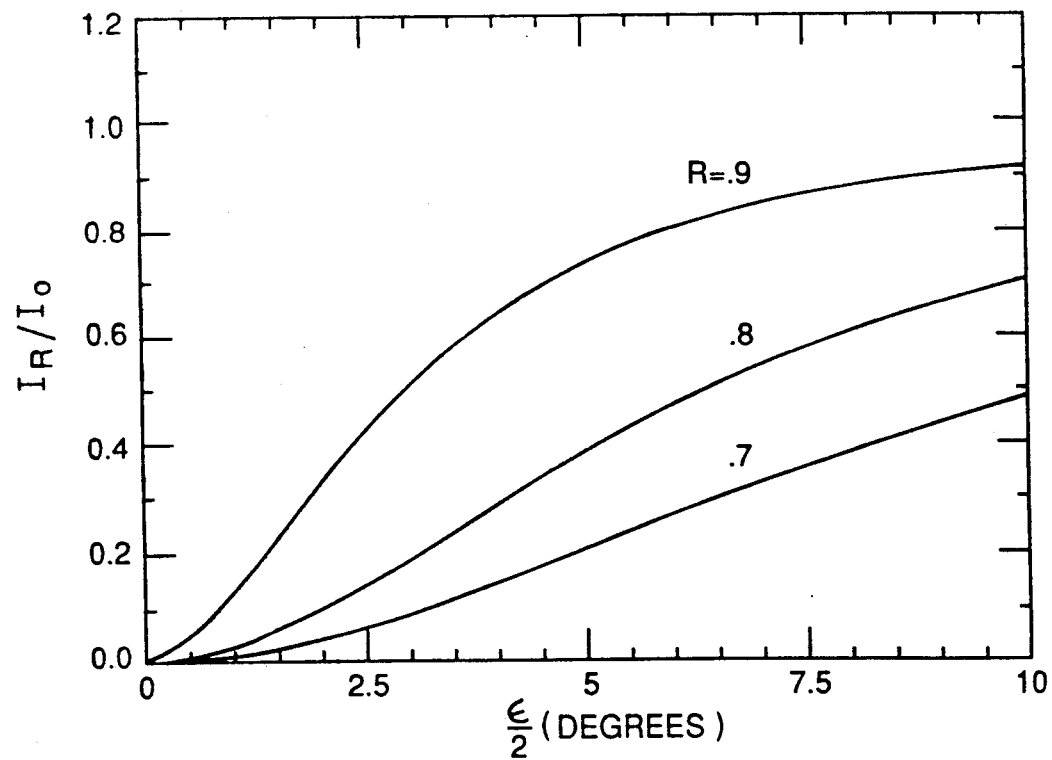
FIG. 10 illustrates reflected intensity from FP pixel vs. $\epsilon/2$.

Looking at the transmission results of FIGS. 7 and 8, we see some useful findings: At R=0.8, the input $\epsilon = 10°$ produces $\Delta\Phi_t = 78°$, and $I_t = 62\%$ at $\phi = m\pi \pm \epsilon/2$, while at R=0.9, the input $\epsilon = 10°$ produces $\Delta\Phi_t = 120°$ and $I_t = 26\%$. In the latter case, the phase enhancement $\Delta\Phi/\epsilon$ is 12:1. Turning to the reflection results of FIGS. 9 and 10: at R=0.8, the input $\epsilon = 3°$ produces $\Delta\Phi_r = 156°$ and $I_r = 5\%$, while at R=0.9, the input $\epsilon = 3°$ produces $\Delta\Phi_r = 126°$ and $I_r = 20\%$. The phase swings $\Delta\Phi_t$ and $\Delta\Phi_r$ are comparable at $R = 0.9$. Although the phase enhancement is $\Delta\Phi/\epsilon$ is greater in the reflective SLM, the initial bias point is quite close to the critical point, and the stability of that bias point might be called into question by variations in temperature, wavelength, and incidence angle. The transmissive SLM is more forgiving because the initial bias is farther from the critical point; thus transmissive etalons are probably preferred. A good operating point for the transmissive SLM is the 10 degree $\epsilon$—excursion ($0.056\pi$ rad) at $R = 0.9$ where the PM of $0.67\pi$ rad occurs with 5.7 dB of throughput loss.

The above results are now applied to MQW SLMs. Below-bandgap light (from source 15 of FIG. 2) would be used in the MQWs, that is, the photon energy $h\nu$ would be less than the energy $E_1$ of the ground state exciton absorption peak. Specifically, the energy $h\nu$ of the principal FP resonance is positioned 20 to 30 meV lower than $E_1$ to assure high transmission (low loss), high $\Delta n$, and a high $\Delta n/\Delta k$ ratio. The energy detuning $E_1 - h\nu$ is selected to give a tradeoff that maximizes $\Delta n$ while minimizing $\Delta k$ and $k$. It may be necessary to limit the optical intensity incident upon the SLM to avoid nonlinear optical effects and optical bistability.

We can determine the required index perturbation $\Delta n/n$ and MQW stack thickness $d$ by writing $$\Delta = a\pi \text{ rad}$$

$$\delta_i = m\pi \text{ rad}$$

where $a << 1$. Using Eqns. (1) and (2) with $\theta = 0$, we find that $$\Delta n/n = a/m$$

$$d = m\lambda/2n\Gamma \qquad (9)$$

in the phase-dominant SLM. To minimize $d$, it is important to get $\Gamma$ 0.5, which can be done with a fairly conventional well-and-barrier structure consisting of one or two wells per period in the stack (the active material fills 50% of the stack). Probably the best choice for the electrooptic MQW materials system is the AlGaAs/GaAs system. Here, the operating wavelength is relatively short, about 0.86 m, a wavelength half as large as that used in the InGaAs/InAlAs system. Small $\lambda$ helps us attain small $d$, and makes photodetection easier.

Strong field effects are present in III-V MQW materials; however, a field effect sometimes suffers from a red-shift problem and has high voltage requirements. For example, in the quantum-confined Stark effect (QCSE), the zero-bias absorption spectrum shifts towards the red during voltage application, which introduces optical loss at the operating wavelength. In the Wannier-Stark effect, a blue shift in the 756-nm absorption edge of a GaAs/AlGaAs superlattice under an electric field is observed, but the properties of these superlattice devices are not well understood at this time.

A better choice of electrooptic mechanism for the PM application is a carrier-induced $\Delta n$. See R. A. Soref and B. R. Bennett, "Carrier Refraction in Quantum Well Waveguides", Applied Optics, vol. 28, pp 3577-3580 (Sep. 1, 1989). This is a polarization-independent effect. The physical mechanism would be phase-space absorption quenching, and the electrooptic structure would be an undoped MQW stack located in the i-region of a forward-biased p-i-n diode. In this way, large concentrations of electrons and holes could be injected into the wells, producing $\Delta n/n$ of $> 1\%$ under high injection. Carrier injection has the benefit of blue-shifting the zero-bias absorption spectrum, which preserves the material's transparency in the voltage-on state. The addressing voltages for the p-i-n diode structure would be less than 2 volts, even for $d \sim 2$ $\mu$m, and the pixel currents would be $\sim 0.1$ mA. The addressing speed of such pixels would be limited to about 50 MHz due to recombination of electrons and holes. See J. E. Zucker, T. Y. Change, M. Wegener, N.J. Sauer, K. L. Jones, and D. S. Chemla, "Large Refractive Index Changes in Tunable-Electron-Density InGaAs/InAlAs Quantum Wells", Photonics Technology Letters, vol. 2, pp 29-31 (Jan. 1990). The two-dimensional SLM array would have the appearance of a surface-normal laser-diode array, except that the peak reflection wavelength of the multi-layer dielectric mirrors $1a, 1b$ of FIG. 1 would be positioned at a wavelength longer than any gain wavelength.

Figure 11:
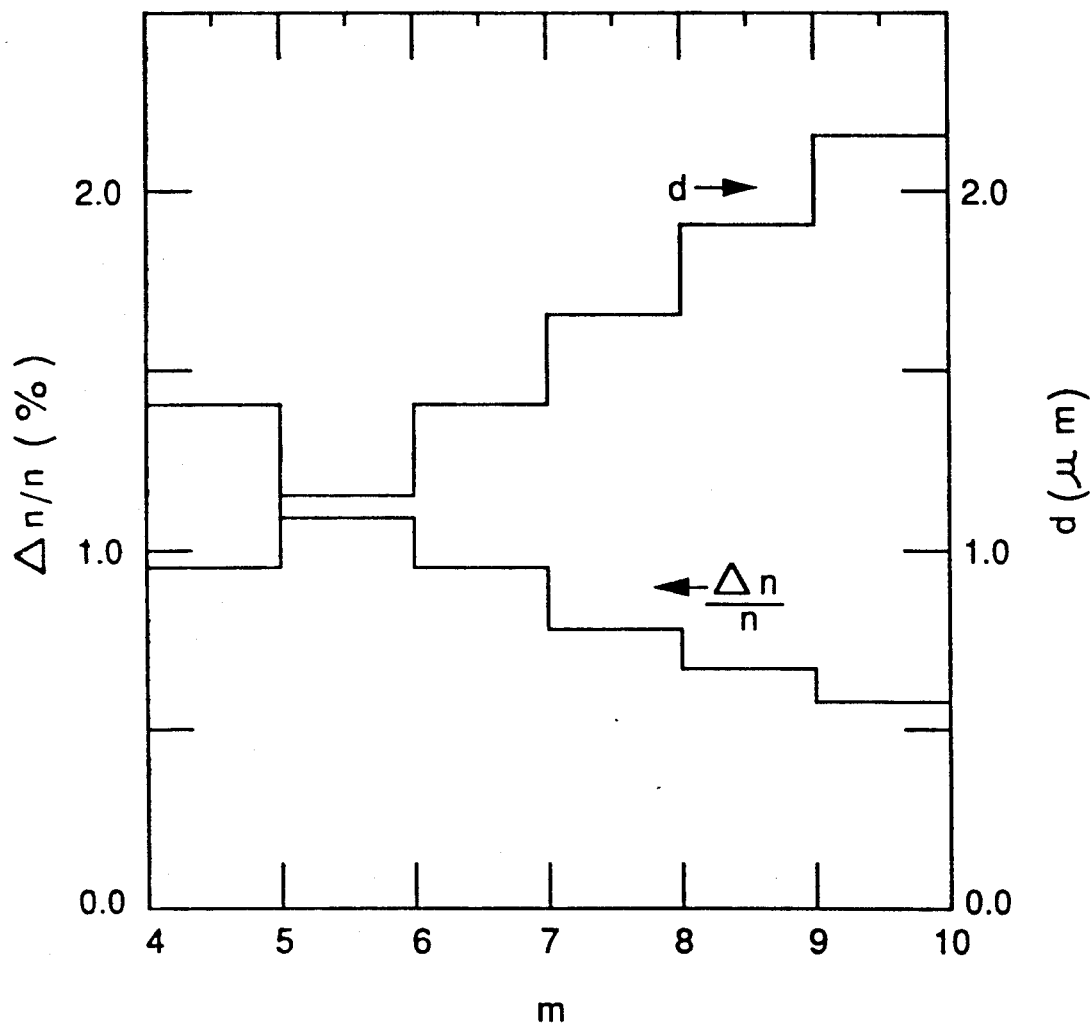
FIG. 11 illustrates required index change and MQW stack thickness as a function of the resonator bias index, m, with $\Gamma=0.5$, $\lambda=0.86$ $\mu$m, m=3.6 and a=0.056.

A numerical example will illustrate the AlGaAs/GaAs MQW case. We shall assume $\Gamma = 0.5$, $\lambda = 0.86$ $\mu$m, $m = 3.6$ (an average value for the stack). We also take a $= 0.056$, which produces $\Delta\Phi t = 0.67\pi$ rad. From (9), the values of $\Delta n/n$ and $d$ can now be plotted as a function of $m$, as shown in FIG. 11. It is seen that a good compromise m-value is: $m = 7$, where $\Delta n/n = 0.8\%$ and $d = 1.67$ $\mu$m. This d-value would require about 84 periods. For $m = 7$, $\Delta n = 0.029$, and in a QCSE field-effect device this index change would require an applied electric field of 2 to 5 V/$\mu$m, depending upon the well-and-barrier thicknesses and the Al fraction. The pixel voltage would be 3.3 to 8.4 V at $d = 1.67$ $\mu$m.

It is interesting to compare the FP cavity result with the result for non-resonant MQW pixels. The pixel thickness $d_{non}$ required in a non-resonant SLM is related to $d_{res}$ the resonant stack thickness by: $d_{non}/d_{res} = \Delta\Phi/\delta_N$, which is 12:1 in the above example. Therefore, $d_{non} = 20$ m would be needed for the same depth of phase modulation.

A fabrication error in the microlayer thicknesses or in the MQW material composition may make it difficult to hit the exact initial biasing point $\delta_i$. To overcome this difficulty, we can introduce voltage trimming. We propose a two-level driving scheme; $V_1$ and $V_2$, for which the phases are $\epsilon_1$ and $\epsilon_2$. In the previous example, where $V_1 = 0$, we found an optimum electrooptic excursion $\epsilon_{opt}$. In the two-level case, the pixel is fabricated with an untrimmed initial phase $\delta_i = m\pi - \epsilon_{opt}$. The trimming $\epsilon_1 \approx 0.5$ $\epsilon_{opt}$ is then added to make a voltage-tuned (unswitched) initial state $\phi_i = m\pi - \epsilon_{opt} + \epsilon_1$. The final (switched) state is $\phi_f = m\pi - \epsilon_{opt} + \epsilon_2$. As before, the initial and final states are symmetric about $m\pi$, and $\phi_i - \phi_f = \epsilon_{opt}$. However, the total excursion $\epsilon_2$ is now larger than before: $\epsilon_2 \approx 1.5$ $\epsilon_{opt}$. The practicality of our resonant pixel design may depend upon the sensitivity of the initial bias point $\delta_i$ to changes in temperature, wavelength, and incidence angle.

Having discussed a binary-phase technique, we would like to mention another possibility. When used in reflection, the FP pixels are suitable for a three-level or ternary SLM. There are three phase levels $\Phi r_1$, $\Phi r_2$, $\Phi r_3$, and one of these states is required to have zero amplitude. This is obtained at $\phi = m\pi$ rad where $I_r = 0$. Hence, the three input phases or "drive states" are: $\phi_1 = m\pi - \epsilon/2$, $\phi_2 = m\pi$, and $\phi_3 = m\pi + \epsilon/2$.

In summary, we have analyzed phase enhancement in electrooptic picture elements sandwiched between Fabry-Perot electrodes. The reflected and transmitted outputs were examined for the balanced and unbalanced mirror cases. A transmissive phase modulation of $0.7\pi$ radians was found for 95% reflectors. This phase shift is a 12-fold enhancement of the voltage-induced single-pass phase shift. Implementation of the resonant phase-dominant spatial light modulator in an AlGaAs/GaAs MQW structure is preferred. Field effects and carrier-induced electrooptic effects are suggested for the MQWs.

While preferred embodiments of the present invention have been described, numerous variations will be apparent to the skilled worker in the art, and thus the scope of the invention is to be restricted only by the terms of the following claims and art recognized equivalents thereof.

What is claimed is:

1. A resonant phase dominant Fabry Perot spatial light modulator for phase modulating light directed therethrough comprising:
   (a) a light transmissive array of p-i-n diodes having a semiconductor superlattice within intrinsic regions of said p-i-n diodes;
   (b) light transmissive partially reflecting first and second electrode means positioned upon opposite faces of said array of p-i-n diodes respectively, configured to form Fabry Perot resonators;
   (c) means for directing light to be phase modulated through at least one of said electrode means and a said array of p-i-n diodes; and
   (d) electric field producing means coupled to said electrode means, for producing a Wannier-Stark blue shift in the absorption spectrum of said superlattice, sufficient to induce electro-optic phase excursions in said p-i-n diodes within a critical rapid phase change region positioned about a Fabry Perot amplitude resonance point of said Fabry Perot resonators, for in turn producing large output phase changes in said light transmitted directed through said array of p-i-n diodes.

2. The modulator of claim 1 wherein said superlattice is a GaAs/AlGaAs superlattice having a blue shift in it's 756-nm absorption edge under the influence of an electric field.

3. A resonant phase dominant spatial light modulator for phase modulating light directed therethrough comprising:
   (a) a light transmissive multiple quantum well (MQW) body including an array of p-i-n diodes having quantum well stacks within intrinsic regions of said p-i-n diodes;
   (b) light transmissive partially reflecting first and second electrode means positioned upon opposite faces of said array of p-i-n diodes respectively, configured to form Fabry-Perot resonators having a given Fabry-Perot amplitude resonance point;
   (c) biasing means for causing said p-i-n diodes to assume a first electrical state or a second electrical state, said biasing means including means for injecting carriers into said p-i-n diodes when said p-i-n diodes assume said second electrical state; and
   (d) means for directing light through said array of p-i-n diodes having a photon energy below the MQW band gap when said p-i-n diodes assume either said first state or said second state and said light having a wavelength which is off-resonance with respect to the Fabry-Perot amplitude resonance point when said p-i-n diodes assume said first electrical state or said second electrical state.

4. The modulator of claim 3 wherein said biasing means comprises voltage trimming means for applying first and second bias voltages to said electrode means having values which induce a rapid phase change of said light symmetrically about said Fabry-Perot amplitude resonance point, thereby to cause the amplitude of said light to remain constant regardless of large output phase changes of light modulated by said spatial light modulator.

5. The light modulator of claim 3 wherein said first and second electrode means each comprise localized, small-area parallel planar pixel electrodes in a two-dimensional array.

6. The light modulator of claim 5 wherein said electrode means include a first set of parallel linear conductive strips superimposed upon row arrays of pixel electrodes on said first surface of said body and a second set of parallel linear conductive strips superimposed upon column arrays of pixel electrodes on said second surface of said body and orthogonal to said first set of strips for defining a two-dimensional X-Y addressed array of pixel elements within said MQW body.

7. The light modulator of any one of claims 5 and 6 wherein said MQW body includes an undoped MQW stack located in the intrinsic region of a p-i-n diode, with one distinct p-i-n diode being provided for each pixel.

8. The light modulator of claim 5 wherein said MQW body includes well-and-barrier structure having one or two wells per period in the MQW layers.

9. The light modulator of claim 5 wherein said MQW body includes well-and-barrier structure having one or two wells per period in the MQW layers.

10. The light modulator of claim 3 wherein said MQW body comprises as AlGaAs/GaAs system.

11. The modulator of claim 1 wherein said carrier injection means comprises means for injecting about $10^{18}$ carriers/cm$^3$ into said quantum well stacks of said p-i-n diodes, thereby to produce carrier induced index changes therein.

12. The modulator of claim 4 wherein said carrier injection means comprises means for injecting about $10^{18}$ carriers/cm$^3$ into said quantum well stacks of said p-i-n diodes, thereby to produce carrier induced index changes therein.

13. The modulator of any one of claims 11 and 12 wherein said partially reflecting first and second electrode means have equal values of reflectance.

14. The modulator of any one of claims 11 and 12 wherein said quantum well layers have a quantum-well filling factor of about 0.5, thereby to minimize the thickness of said quantum well layers.

15. The light modulator of claim 12 wherein said MQW body comprises a AlGaAs/GaAs system.

16. The light modulator of claim 3 wherein said light transmissive MQW body has a stack thickness of less than two microns.

17. The light modulator of claim 3 wherein said light transmissive MQW body has a stack thickness of less than two microns.

18. The light modulator of claim 4 wherein said light transmissive MQW body has a stack thickness of less than two microns.

19. The light modulator of claim 12 wherein said light transmissive MQW body has a stack thickness of less than two microns.

20. The modulator of any one of claims 11 and 12 wherein light directed therethrough has a given wavelength, and said p-i-n diodes are made of material highly transparent at said given wavelength during the operation of said spatial light modulator.

21. The light modulator of claim 13 wherein said reflectance is about 0.8 or more at the wavelengths of operation.

* * * * *